United States Patent [19]

Widmann

[11] 4,268,563
[45] May 19, 1981

[54] RADIATION MASK FOR PRODUCING STRUCTURAL CONFIGURATIONS IN PHOTO-SENSITIVE RESISTS BY X-RAY EXPOSURE

[75] Inventor: Dietrich Widmann, Unterhaching, Fed. Rep. of Germany

[73] Assignee: Siemens Aktiengesellschaft, Berlin & Munich, Fed. Rep. of Germany

[21] Appl. No.: 42,533

[22] Filed: May 25, 1979

Related U.S. Application Data

[63] Continuation of Ser. No. 501,692, Aug. 29, 1974, abandoned

Foreign Application Priority Data

[30] Sep. 17, 1973 [DE] Fed. Rep. of Germany ...... 2346719

[51] Int. Cl. ............... B32B 3/24; B32B 7/02; B32B 17/10; B32B 33/00
[52] U.S. Cl. ............... 428/138; 428/210; 428/337; 428/428; 428/434; 428/435; 428/448; 428/450
[58] Field of Search ............... 428/138, 210, 337, 428, 428/435, 434, 448, 450

[56] References Cited

PUBLICATIONS

Spears et al., *Solid State Technology*, Jul. 1972, pp. 21–26.

*Primary Examiner*—James C. Cannon
*Attorney, Agent, or Firm*—Hill, Van Santen, Steadman, Chiara & Simpson

[57] ABSTRACT

A radiation mask having a masking structure and a carrier therefore, for the production of structural configurations in photosensitive resists by x-ray radiation, with the carrier having registration marks thereon, in which the carrier comprises a layer of approximately 3 to 10 μm in thickness, which layer is formed of material penetratable both by x-rays and by radiation in the visible part of the spectrum, the carrier material preferably being polyimide resin or silicon dioxide produced thermally or by a sputtering technique. In a further embodiment the carrier may comprise a first layer of silicon dioxide and a second supporting layer of polyimide resin.

4 Claims, 4 Drawing Figures

RADIATION MASK FOR PRODUCING STRUCTURAL CONFIGURATIONS IN PHOTO-SENSITIVE RESISTS BY X-RAY EXPOSURE

This is a continuation of application Ser. No. 501,692 filed Aug. 29, 1974 and now abandoned.

BACKGROUND OF THE INVENTION

The present invention is directed to a radiation mask having a masking structure and a carrier therefor, designed to produce desired structural configurations in photosensitive resists by the utilization of x-ray radiation, aligning or registration marks being provided on the carrier.

From the publication "Solid State Technology", July 1972, pages 21 to 25, there is disclosed, that for manufacturing semiconductor devices with structural dimensions in the micron range, x-rays can be used to expose the photosensitive resist. The use of x-rays for the exposure enables more accurate reproduction of the masking structures on the photosensitive resist layer because of the reduction in diffraction phenomena, in particular if a space must be maintained between radiation mask and photosensitive resist layer during the exposure. According to the prior art, the x-rays are also used in the alignment of the geometric position i.e. registration alignment of the radiation mask with respect to the semiconductor wafers upon which the photosensitive resist layer is disposed.

The use of x-rays for the alignment of the positions of the semiconductor wafers involves a relatively large outlay in terms of x-ray equipment. Furthermore, additional operations have to be performed on the semiconductor wafers as the latter must be etched thin at corresponding locations. Moreover, when working with x-rays, considerable safety precautions must be taken to protect the operators, so that again an additional outlay is required.

The present invention, therefore, has among its objects to make possible, in the context of lithographic processes in which structural configurations are to be produced in the photosensitive resist by x-ray radiation, to avoid the necessity of utilizing x-rays for the period of time involved in effecting alignment operations in connection with the registration of the semiconductor wafers with the radiation mask.

This object is achieved in accordance with the invention by the utilization of a radiation mask of the type heretofore described in which the carrier comprises a layer of material, of approximately 3 to 10 μm in thickness, which material is penetrable by x-rays and by radiation in the visible part of the spectrum.

The invention proceeds from the recognition that when observing aligning marks with the microscope the semiconductor wafer carrying the photosensitive resist must not be traversed by radiation. For alignment purposes, a microscope utilizing light from the visible part of the spectrum can be utilized if the carrier of the radiation mask also is penetrable by such radiation.

BRIEF DESCRIPTION OF THE DRAWINGS

In the drawings wherein like reference characters indicate like or corresponding parts.

DETAILED DESCRIPTION

Figure 1:
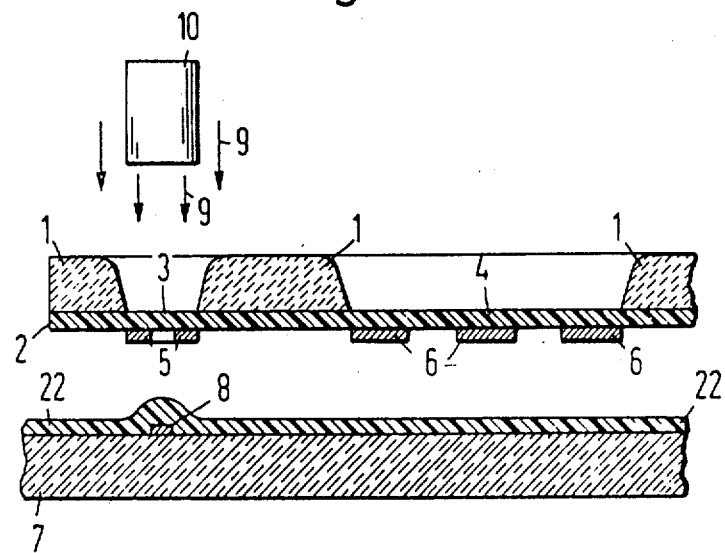
FIG. 1 is a sectional view of a preferred form of the invention.

FIG. 1 illustrates a preferred example of a structure constructed in accordance with the present invention, in which the radiation mask 1 comprises a silicon body which is coated on one surface with a carrier layer 2 of polyimide resin which is about 1 to 5 μm in thickness. The areas 3 and 4 of the radiation mask have been etched by the use of a suitable selective etching agent which attacks only the silicon and not the polyimide. At the area 3, there is applied to the carrier 2 an adjustment or registration mark 5, of gold, having a thickness of about 1 μm. In like manner, secured to the carrier 2 at the area 4 thereof are similar masking structures 6. A cooperable complementary adjustment or registration mark 8 is applied to the semiconductor wafer 7, which is to be processed, and which carries a photosensitive resist layer 22, with the cooperable registration marks being aligned with the assistance of light rays 9, which are illustrated as being perpendicularly incident upon the carrier, and the cooperable microscope 10. The alignment of the position of the semiconductor wafer 7 is completed when the contours of the mark 8 can be fully seen, in the incident light, through the microscope. The advantage of the use of incident visible light radiation in the alignment of the semiconductor wafer resides in the fact that the light rays 9 do not, in contrast to adjustment techniques employing x-rays, have to pass through the semiconductor wafer 7. As a result thereof, etching of the wafer in the vicinity of the aligning mark in order to reduce the thickness of the wafer thereat is rendered unnecessary. A further advantage resides in the use of ordinary commercially available optical aligning equipment, i.e. aligning microscopes, which merely require simple coupling with an additional device for x-ray exposure.

Figure 2:
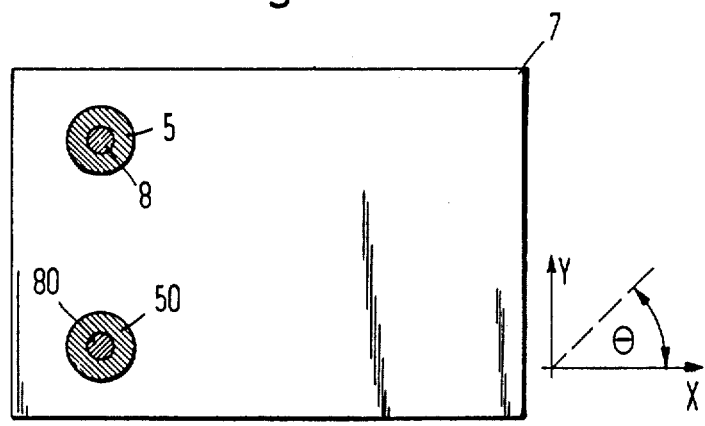
FIG. 2 is a plan view of a device such as illustrated in FIG. 1, illustrating merely the registration structures.

As the semiconductor wafer 7 is capable of movement with two linear degrees of freedom (x, y) and with one rotational degree of freedom (θ), on its mounting, in order to accurately and unambiguously position the wafer 7 relative to the mask, two pairs, preferably identical, of adjusting marks are required for the desired alignment and registration. FIG. 2 illustrates a suitable arrangement of aligning marks on the surface of the semiconductor wafer 7 and mask 1. In this illustration, the aligning or registration marks 5 and 8 may be utilized, for example, for effecting registration in the x and y directions and the aligning marks 50 and 80, for example, for effecting rotational registration.

In accordance with a further development of the invention, advantageously the carrier for the masking structures comprises a $SiO_2$ layer having a thickness of between 3 and 10 μm, which can, for example, be produced thermally or by the use of a sputtering technique.

Figure 3:
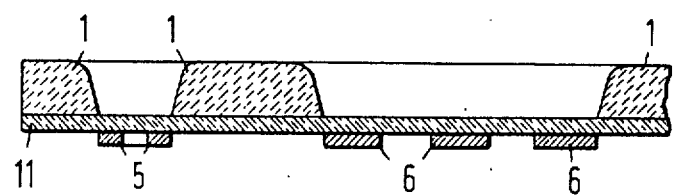
FIG. 3 is a sectional view similar to FIG. 1 through a modified form of radiation mask.

FIG. 3 illustrates a cross-section through the radiation mask 1, provided with a carrier comprising a layer 11 of $SiO_2$ with a thickness of approximately 5 μm. The masking structure 6 and the aligning marks 5 are disposed on the layer 11. The radiation mask illustrated in FIG. 3 also has the advantage that the carrier of $SiO_2$ has a higher temperature stability than synthetic resin heretofore employed. Further, silicon dioxide possesses a lower coefficient of thermal expansion.

Figure 4:
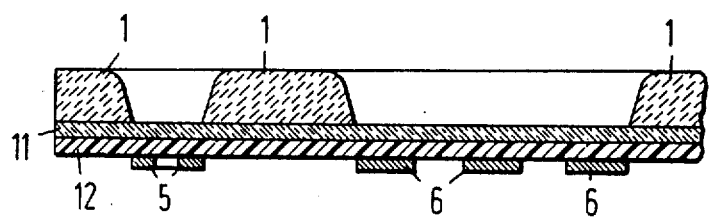
FIG. 4 is a sectional view, similar to FIG. 3, of a further modified form of radiation mask.

In accordance with a further embodiment of the invention, the strength of the carrier can be additionally improved if an additional layer of synthetic resin is applied to the layer of SiO₂. FIG. 4 illustrates such a construction, in which the carrier comprises a layer 11 of SiO₂ and an additional supporting layer 12 of synthetic resin. Preferably, the supporting layer 12 comprises a synthetic resin polyimide with a thickness of between 3 and 10 μm. In this construction, the masking structures 6 and the adjusting mark 5 are disposed on the supporting layer 12.

Although particular embodiments of the invention have been described and illustrated herein, it is recognized that modifications and variations may readily occur to those skilled in the art and consequently it is intended that the claims be interpreted to cover all such modifications and equivalents.

I claim:

1. A multilayer radiation mask useful in controlling the selective activation of a photosensitive layer with X-ray radiation, in which registration of a first mark, associated with the mask, with a cooperable second mark, associated with the photosensitive layer, is visually effected by the use of incident radiation in the visible part of the spectrum to illuminate such registration marks through the mask, comprising:

a silicon dioxide carrier layer of approximately 1 to 10 micrometers in thickness, said silicon dioxide carrier layer being permeable to X-rays and visible light;

a silicon layer carried on a first surface of said carrier layer, said silicon layer including openings therethrough exposing areas of the adjacent first surface of said carrier layer;

an X-ray absorptive polyimide resin layer carried on an opposite second surface of said carrier layer at an area thereof spanning an opening in said silicon layer; and a first registration mark carried by said absorptive layer layer and adapted to cooperate with a similar second registration mark carried by the photosensitive layer, exposure with visible light through said mask causing the images of the first and second registration marks to be transmitted through said carrier layer so that the marks may be visually observed at the exposed face of said carrier layer to enable visual determination of the relative positions of the registration marks.

2. The radiation mask of claim 1, wherein the first registration mark has a first profile and the second registration mark has a second profile complementary to the first profile.

3. The registration mask of claim 1, wherein the first registration mark has a regularly shaped opening therein and the second registration mark is shaped so that its image exactly fills the image of that opening upon alignment.

4. The registration mask of claim 3, wherein said regularly shaped opening is circular.

* * * * *